United States Patent
Jiang (10) Patent No.: US 11,430,930 B2
(45) Date of Patent: Aug. 30, 2022

(54) DISPLAY PANEL AND DISPLAY DEVICE WITH DUAL SUBSTRATES

(71) Applicant: SHENZHEN CHINA STAR OPTOELECTRONICS SEMICONDUCTOR DISPLAY TECHNOLOGY CO., LTD., Shenzhen (CN)

(72) Inventor: Bei Jiang, Shenzhen (CN)

(*) Notice: Subject to any disclaimer, the term of this patent is extended or adjusted under 35 U.S.C. 154(b) by 132 days.

(21) Appl. No.: 16/627,783

(22) PCT Filed: Dec. 10, 2019

(86) PCT No.: PCT/CN2019/124220
§ 371 (c)(1),
(2) Date: Dec. 31, 2019

(87) PCT Pub. No.: WO2021/103132
PCT Pub. Date: Jun. 3, 2021

(65) Prior Publication Data
US 2021/0328118 A1    Oct. 21, 2021

(30) Foreign Application Priority Data
Nov. 27, 2019   (CN) .......................... 201911180488.X (51) Int. Cl.
*H01L 29/20*   (2006.01)
*H01L 33/00*   (2010.01)
*H01L 33/62*   (2010.01)
*H01L 23/544*   (2006.01)
*H01L 25/075*   (2006.01)
(Continued)

(52) U.S. Cl.
CPC ............ *H01L 33/62* (2013.01); *H01L 23/544* (2013.01); *H01L 25/0753* (2013.01); *H01L 27/0296* (2013.01); *H01L 27/1214* (2013.01); *G09G 3/32* (2013.01); *G09G 2310/0267* (2013.01);
(Continued)

(58) Field of Classification Search
CPC . H01L 33/62; H01L 27/1214; H01L 27/0296; H01L 23/544; H01L 25/0753; H01L 2223/54426; H01L 2933/0066; G09G 2310/0267; G09G 3/32; G09G 2330/04
See application file for complete search history.

(56) References Cited

U.S. PATENT DOCUMENTS 9,148,497 B2 * 9/2015 Penttila ................ H04M 1/026
10,212,819 B2 * 2/2019 Ahn ....................... G06F 3/0412
(Continued)

FOREIGN PATENT DOCUMENTS

CN      104009044 A    8/2014
CN      105206625 A    12/2015
(Continued)

*Primary Examiner* — Ismail A Muse (57) ABSTRACT

The present invention provides a display panel and a display device. The display panel divides a driving circuit of a driving circuit layer into a first portion, a second portion, and a connecting portion. The first portion and the second portion are on opposite sides of a substrate. A projection region of the second portion on the substrate is located in a projection region of the first portion on the substrate. Therefore, the second portion is located in a display region, a connecting region of external wires which cannot display is eliminated, and a bezel of the display panel is eliminated.

18 Claims, 6 Drawing Sheets

(51) Int. Cl.
*H01L 27/02* (2006.01)
*H01L 27/12* (2006.01)
*G09G 3/32* (2016.01)

(52) U.S. Cl.
CPC ............... *G09G 2330/04* (2013.01); *H01L 2223/54426* (2013.01); *H01L 2933/0066* (2013.01)

(56) References Cited

U.S. PATENT DOCUMENTS

| | | | |
|---|---|---|---|
| 10,754,209 B2* | 8/2020 | Nakui | G09F 9/30 |
| 2007/0053628 A1* | 3/2007 | Park | G02F 1/0121 |
| | | | 385/14 |
| 2014/0111559 A1* | 4/2014 | Yang | G09G 3/2088 |
| | | | 345/690 |
| 2014/0217382 A1* | 8/2014 | Kwon | H01L 51/5246 |
| | | | 257/40 |
| 2014/0246687 A1* | 9/2014 | Ha | G06F 1/1643 |
| | | | 257/668 |
| 2017/0103693 A1 | 4/2017 | Saruhashi | |
| 2018/0005947 A1* | 1/2018 | Kasturi | H01L 23/5385 |
| 2018/0062094 A1* | 3/2018 | Kwon | G06F 1/1652 |
| 2019/0278411 A1* | 9/2019 | Jeon | G02B 5/3025 |
| 2020/0066822 A1* | 2/2020 | Saitoh | H05B 33/06 |
| 2021/0225209 A1* | 7/2021 | Wang | G06F 1/1652 |

FOREIGN PATENT DOCUMENTS

| | | |
|---|---|---|
| CN | 105870159 A | 8/2016 |
| CN | 106371658 A | 2/2017 |
| CN | 106653777 A | 5/2017 |
| CN | 106887187 A | 6/2017 |
| CN | 107331800 A | 11/2017 |
| CN | 107784940 A | 3/2018 |
| CN | 108231852 A | 6/2018 |
| CN | 108766994 A | 11/2018 |
| CN | 109377877 A | 2/2019 |
| CN | 109671352 A | 4/2019 |
| CN | 109920804 A | 6/2019 |
| CN | 109962095 A | 7/2019 |
| CN | 209199067 U | 8/2019 |
| CN | 110221472 A | 9/2019 |
| CN | 110262701 A | 9/2019 |
| CN | 110297346 A | 10/2019 |
| CN | 110323231 A | 10/2019 |
| CN | 110379314 A | 10/2019 |

\* cited by examiner

DISPLAY PANEL AND DISPLAY DEVICE WITH DUAL SUBSTRATES

CROSS-REFERENCE TO RELATED APPLICATIONS

This application claims the priority to Chinese Patent Application No. 201911180488.X, entitled "DISPLAY PANEL AND DISPLAY DEVICE" and filed on Nov. 27, 2019 with the State Intellectual Property Office of the People's Republic of China, which is entirely incorporated by reference into the present application.

FIELD OF INVENTION

The present invention is related to the field of display technology, and specifically to a display panel and a display device.

BACKGROUND OF INVENTION

A current light-emitting diode (LED) display panel adopts a mini-LED or a micro-LED as a light-emitting layer. It disposes the mini-LED or micro-LED on a driving backplane, and the driving backplane drives the mini-LED or micro-LED to emit light and implement display. The driving backplane has a display region and a connecting region of external wires. A driving circuit is disposed between the display region and the connecting region of the external wires. Because the connecting region of the external wires cannot display, the LED display panel has a bezel, which affects viewing.

Accordingly, current LED display panels have a technical problem of a large bezel due to a large connecting region of external wires.

SUMMARY OF INVENTION

The present invention provides a display panel and a display device to solve a technical problem of a large bezel due to a large connecting region of external wires in current LED display panels.

In order to solve the above problem, the present invention provides technical solution as follows:

the present invention provides a display panel, the display panel includes:

a substrate;

a driving circuit layer attached to the substrate and including a driving circuit, wherein the driving circuit includes a first portion, a second portion, and a connecting portion connecting the first portion and the second portion, the first portion is disposed on a surface of the substrate, and the second portion is disposed on a surface of the substrate away from the first portion;

a light-emitting layer disposed on a surface of the first portion away from the substrate and connected to the first portion; and a packaging layer disposed on a surface of the light-emitting layer away from the first portion;

wherein a projection region of the second portion on the substrate is located in a projection region of the first portion on the substrate.

In the display panel provided by the present invention, the substrate includes a first substrate, a second substrate, and an optical adhesive disposed between the first substrate and the second substrate, the first portion is disposed on a surface of the first substrate away from the second substrate, and the second portion is disposed on a surface of the second substrate away from the first substrate.

In the display panel provided by the present invention, a size of the first substrate is same as a size of the second substrate.

In the display panel provided by the present invention, a first alignment terminal is disposed on the first substrate, and a second alignment terminal is disposed on the second substrate to cooperate with the first alignment terminal.

In the display panel provided by the present invention, the first alignment terminal includes a protrusion, and the second alignment terminal includes a groove to cooperate with the first alignment terminal.

In the display panel provided by the present invention, the first alignment terminal includes a groove, and the second alignment terminal includes a protrusion to cooperate with the first alignment terminal.

In the display panel provided by the present invention, the second portion of the driving circuit includes an electrostatic protection circuit disposed on a lower side of the substrate, the substrate includes an upper side surface, a lower side surface, a left side surface, and a right side surface, and the connecting portion is disposed on the lower side surface of the substrate.

In the display panel provided by the present invention, the second portion of the driving circuit includes gate driving circuits disposed on both sides of the substrate, the substrate includes an upper side surface, a lower side surface, a left side surface, and a right side surface, and the connecting portion is disposed on the left side surface and the right side surface of the substrate.

In the display panel provided by the present invention, the light-emitting layer includes mini light-emitting diode (LED) chips, and the mini LED chips include a red mini LED chip, a green mini LED chip, and a blue mini LED chip.

In the display panel provided by the present invention, the connecting portion includes a plurality of connecting wires and bonding terminals on both sides of each of the plurality of connecting wires, and the bonding terminals are respectively connected to the first portion and the second portion.

Meanwhile, the present invention further provides a display device, the display device includes:

a display panel including a substrate, a driving circuit layer, a light-emitting layer, and a packaging layer, wherein the driving circuit layer is attached to the substrate and includes a driving circuit, the driving circuit includes a first portion, a second portion, and a connecting portion connecting the first portion and the second portion, the first portion is disposed on a surface of the substrate, the second portion is disposed on a surface of the substrate away from the first portion, the light-emitting layer is disposed on a surface of the first portion away from the substrate and is connected to the first portion, the packaging layer is disposed on a surface of the light-emitting layer away from the first portion, and a projection region of the second portion on the substrate is located in a projection region of the first portion on the substrate; and a flip-chip film connected to the second portion.

In the display device provided by the present invention, the second portion includes a metal wire and a connecting terminal, and the flip-chip film is connected to the connecting terminal.

In the display device provided by the present invention, the substrate includes a first substrate, a second substrate, and an optical adhesive disposed between the first substrate and the second substrate, the first portion is disposed on a surface of the first substrate away from the second substrate, and the second portion is disposed on a surface of the second substrate away from the first substrate.

In the display device provided by the present invention, a size of the first substrate is same as a size of the second substrate.

In the display device provided by the present invention, a first alignment terminal is disposed on the first substrate, and a second alignment terminal is disposed on the second substrate to cooperate with the first alignment terminal.

In the display device provided by the present invention, the first alignment terminal includes a protrusion, and the second alignment terminal includes a groove to cooperate with the first alignment terminal.

In the display device provided by the present invention, the second portion of the driving circuit includes an electrostatic protection circuit disposed on a lower side of the substrate, the substrate includes an upper side surface, a lower side surface, a left side surface, and a right side surface, and the connecting portion is disposed on the lower side surface of the substrate.

In the display device provided by the present invention, the second portion of the driving circuit includes gate driving circuits disposed on both sides of the substrate, the substrate includes an upper side surface, a lower side surface, a left side surface, and a right side surface, and the connecting portion is disposed on the left side surface and the right side surface of the substrate.

In the display device provided by the present invention, the light-emitting layer includes mini light-emitting diode (LED) chips, and the mini LED chips include a red mini LED chip, a green mini LED chip, and a blue mini LED chip.

In the display device provided by the present invention, the connecting portion includes a plurality of connecting wires and bonding terminals on both sides of each of the plurality of connecting wires, and the bonding terminals are respectively connected to the first portion and the second portion.

The present invention provides the display panel and the display device. The display panel includes the substrate, the driving circuit layer, the light-emitting layer, and the packaging layer. The driving circuit layer is attached to the substrate and includes the driving circuit. The driving circuit includes the first portion, the second portion, and the connecting portion connecting the first portion and the second portion. The first portion is disposed on the surface of the substrate, and the second portion is disposed on the surface of the substrate away from the first portion. The light-emitting layer is disposed on the surface of the first portion away from the substrate and is connected to the first portion. The packaging layer is disposed on the surface of the light-emitting layer away from the first portion. The projection region of the second portion on the substrate is located in the projection region of the first portion on the substrate. Because the driving circuit of the driving circuit layer is divided into the first portion, the second portion, and the connecting portion, the first portion is disposed on the surface of the substrate, the second portion is disposed on another surface of the substrate, and the projection region of the second portion on the substrate is located in the projection region of the first portion on the substrate. Therefore, the second portion is located in the display region, the connecting region of external wires which cannot display is eliminated, the bezel of the display panel is eliminated, and a technical problem of a large bezel due to a large connecting region of external wires in current LED display panels is solved.

DETAILED DESCRIPTION OF PREFERRED EMBODIMENTS

The present invention provides a display panel and a display device. In order to make purposes, technical solutions, and effects of the present invention clearer and more specific, the present invention is further described in detail below with reference to the accompanying drawings and examples. It should be understood that the specific embodiments described herein are only used to explain the application, and are not used to limit the present invention.

Embodiments of the present invention is used to solve the problem of a large bezel due to a large connecting region of external wires in current light-emitting diode (LED) display panels.

Figure 1:
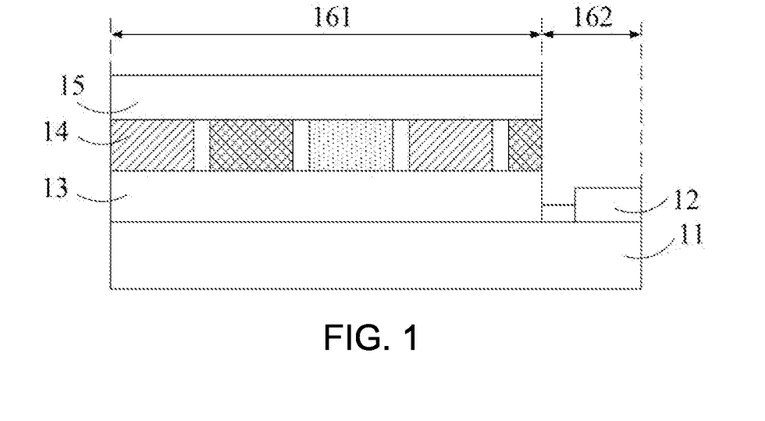
FIG. 1 is a schematic diagram of a display device in the prior art.

As shown in FIG. 1, a current LED display device includes a substrate 11, a driving circuit layer 13 disposed on the substrate 11, a light-emitting chip 14 disposed on the driving circuit layer 13, a packaging layer 15 disposed on the light-emitting chip 14, and a flip-chip film 12 connected to the driving circuit layer 13. A driving circuit of the driving circuit layer 13 extends from a display region 161 to a connecting region of the external wires 162 and the flip-chip film 12. Because the connecting region of the external wires 162 is large and cannot display, a bezel of an LED display panel is large, which causes a technical problem of the large bezel due to the large connecting region of external wires 162 in the current LED display panel.

Figure 2:
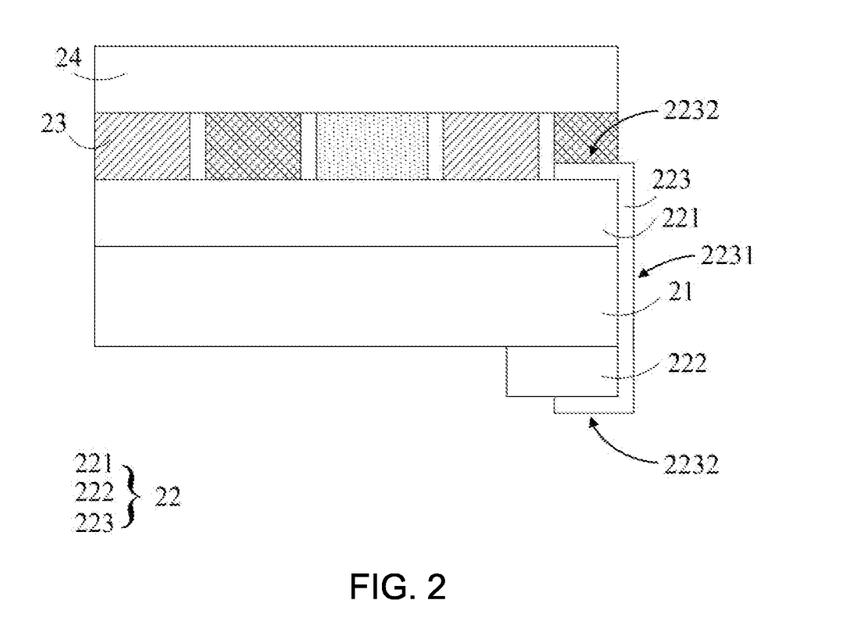
FIG. 2 is a first schematic diagram of a display panel according to an embodiment of the present invention.

As shown in FIG. 2, the present invention provides a display panel, and the display panel includes:

a substrate 21;

a driving circuit layer 22 attached to the substrate 21 and including a driving circuit, wherein the driving circuit includes a first portion 221, a second portion 222, and a connecting portion 223 connecting the first portion 221 and the second portion 222, the first portion 221 is disposed on a surface of the substrate 21, and the second portion 22 is disposed on a surface of the substrate 21 away from the first portion 221;

a light-emitting layer 23 disposed on a surface of the first portion 221 away from the substrate 21 and connected to the first portion 221; and a packaging layer 24 disposed on a surface of the light-emitting layer 23 away from the first portion 221;

wherein a projection region of the second portion 222 on the substrate 21 is located in a projection region of the first portion 221 on the substrate 21.

The present invention provides the display panel. The display panel includes the substrate, the driving circuit layer, the light-emitting layer, and the packaging layer. The driving circuit layer is attached to the substrate and includes the driving circuit. The driving circuit includes the first portion, the second portion, and the connecting portion connecting the first portion and the second portion. The first portion is disposed on the surface of the substrate, and the second portion is disposed on the surface of the substrate away from the first portion. The light-emitting layer is disposed on the surface of the first portion away from the substrate and is connected to the first portion. The packaging layer is disposed on the surface of the light-emitting layer away from the first portion. The projection region of the second portion on the substrate is located in the projection region of the first portion on the substrate. Because the driving circuit of the driving circuit layer is divided into the first portion, the second portion, and the connecting portion, the first portion is disposed on the surface of the substrate, the second portion is disposed on another surface of the substrate, and the projection region of the second portion on the substrate is located in the projection region of the first portion on the substrate. Therefore, the second portion is located in the display region, the connecting region of external wires which cannot display is eliminated, the bezel of the display panel is eliminated, and a technical problem of a large bezel due to a large connecting region of external wires in current LED display panels is solved.

It should be explained that the projection region refers to the largest region formed by the projection of the first portion or the second portion of the driving circuit, that is, when a projection of a wiring of the second portion is not located in a projection of a wiring of the first portion, but the projection of the wiring of the second portion is located in the largest region formed by the projection of the wiring of the first portion, the projection of the second portion is located in the projection of the first portion.

Figure 3:
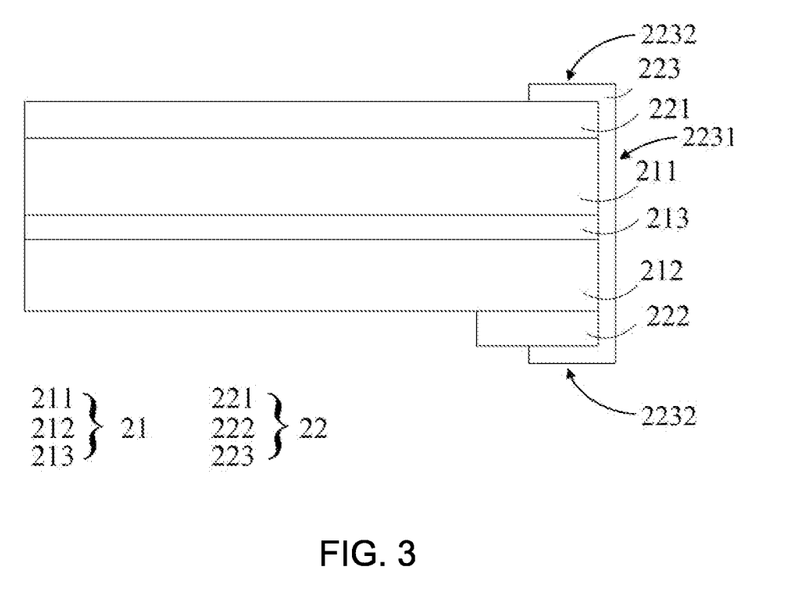
FIG. 3 is a second schematic diagram of a display panel according to an embodiment of the present invention.

In an embodiment, as shown in FIG. 3, the substrate 21 includes a first substrate 211, a second substrate 212, and an optical adhesive disposed between the first substrate 211 and the second substrate 212. The first portion 221 is disposed on a surface of the first substrate 211 away from the second substrate 212, and the second portion 222 is disposed on a surface of the second substrate 212 away from the first substrate 211. In order to dispose the first portion and the second portion in the display region, in one case, the first portion and the second portion of the driving circuit can be formed on a front surface and the back surface of the substrate. In another case, the substrate is divided into the first substrate and the second substrate, the first portion and the second portion of the driving circuit can be formed on the first substrate and the second substrate, and the first substrate and the second substrate are bonded by the optical adhesive. Because the first portion and the second portion of the driving circuit are formed separately, the first portion is prevented from damage when the second portion is formed on the back surface after the first portion is formed on the front surface. Therefore, a manufacturing process is simple and can obtain the driving circuit with a complete first portion and a complete second portion.

In an embodiment, a size of the first substrate is same as a size of the second substrate, which means a length of the first substrate is same as a length of the second substrate, a width of the first substrate is same as a width of the second substrate, and a thickness of the first substrate is same as a thickness of the second substrate. Because the size of the first substrate is same as the size of the second substrate, the first substrate and the second substrate can be selected from a same substrate when providing the first substrate and the second substrate. The thickness of the first substrate can be selected according to thickness requirements of the substrate, so that the obtained substrate thickness will not be too thick and cause the display panel to be too thick, and the obtained substrate thickness will not be too thin and lead to damage to the substrate. Meanwhile, four sides of the first substrate are aligned with four sides of the second substrate, and there is no exceeding side of the two substrates.

In an embodiment, a first alignment terminal is disposed on the first substrate, and a second alignment terminal is disposed on the second substrate to cooperate with the first alignment terminal. When the first substrate and the second substrate are bonded to form the substrate, the first substrate needs to be accurately bonded to the second substrate. Because the first alignment terminal disposed on the first substrate and the second alignment terminal disposed on the second substrate cooperate with each other, the first substrate can be accurately bonded to the second substrate. The two alignment terminals can cooperate with each other by a protrusion and a groove. For example, the first alignment terminal is the protrusion, and the second alignment terminal is the groove to cooperate with the protrusion, or the first alignment terminal is the groove, and the second alignment terminal is the protrusion to cooperate with the groove, so that the first substrate is aligned with the second substrate by the first alignment terminal and the second alignment terminal. It should be explained that considering an optical adhesive disposed between the first substrate and the second substrate, when the optical adhesive is coated on the first substrate or the second substrate, the first alignment terminal and the second alignment terminal should be exposed, so that the first alignment terminal can cooperate with the second alignment terminal.

In an embodiment, scales can be disposed on side surfaces of the first surface and the second substrate, can be disposed on two adjacent side surfaces of the first substrate and second substrate, or can be disposed on four corresponding side surfaces of the first substrate and second substrate. Therefore, the first substrate and the second substrate can be aligned by the aligning scales.

Figure 4:
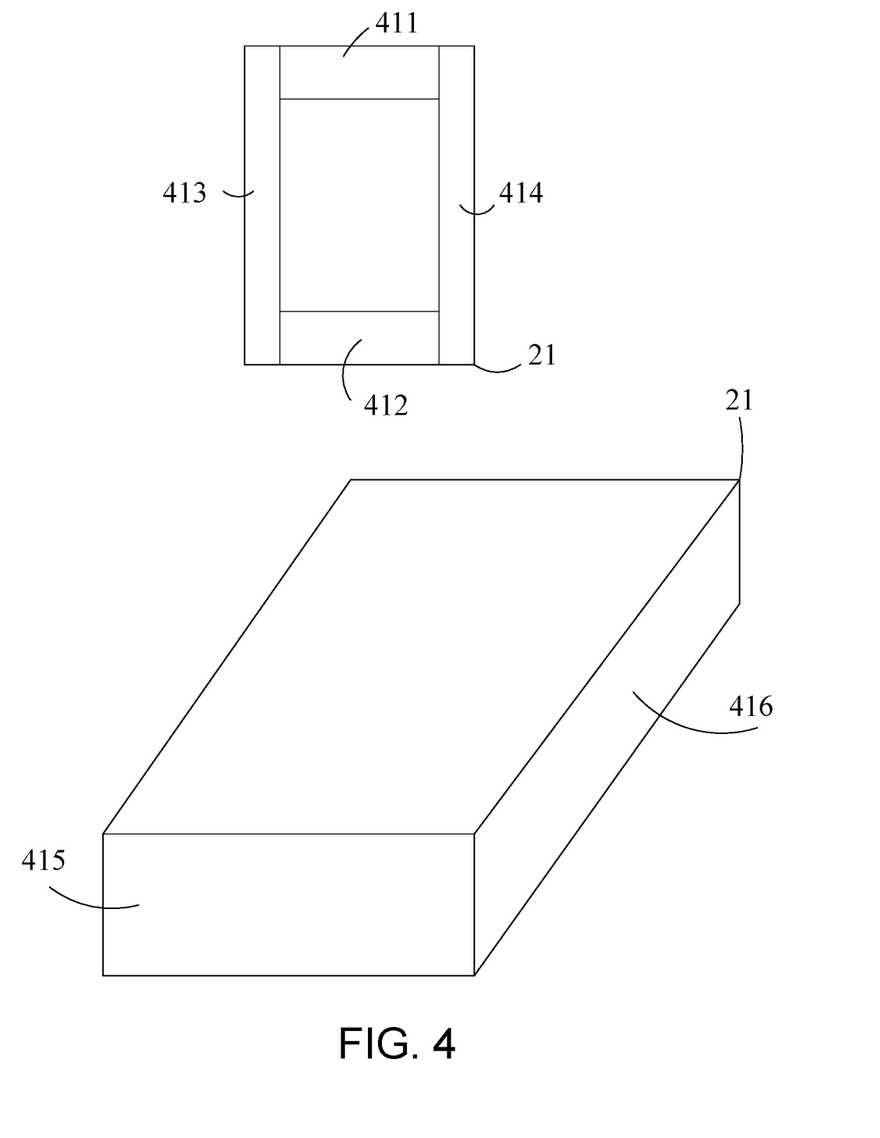
FIG. 4 is a schematic diagram of a substrate according to an embodiment of the present invention.

As shown in FIG. 4, an embodiment of the present invention provides a substrate, the substrate 21 includes an upper side 411, a lower side 412, a left side 413, a right side 414, an upper side surface, a lower side surface 415, a left side surface, and a right side surface 416. The upper side 411 is opposite to the lower side 412, the left side 413 is opposite to the right side 414, the upper side surface is opposite to the lower side surface 415, and the left side surface is opposite to the right side surface 416.

Figure 5:
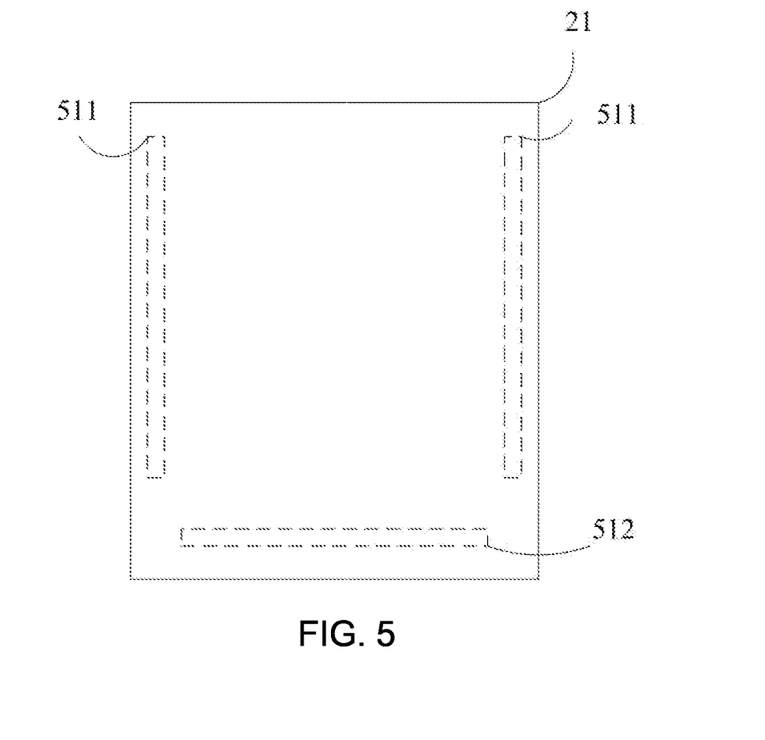
FIG. 5 is a third schematic diagram of a display panel according to an embodiment of the present invention.

In an embodiment, as shown in FIG. 5, the second portion of the driving circuit includes an electrostatic protection circuit 512 disposed on a lower side of the substrate 21. The substrate 21 includes the upper side surface, the lower side surface, the left side surface, and the right side surface, and the connecting portion is disposed on the lower side surface of the substrate 21. In a current display panel, the electrostatic protection circuit is disposed in a non-display region on a lower side of the display panel, causing the presence of a bezel on the lower side of the display panel. This embodiment of the present invention disposes the electrostatic protection circuit on the lower side of the substrate, so that the electrostatic protection circuit is located in the display region of the display panel. The connecting portion is disposed on the lower side surface of the back of the substrate to connect the electrostatic protection circuit and the first portion on the front of the substrate, allowing the electrostatic protection circuit to work normally, so that a lower bezel of the display panel is reduced while not affecting the operation of the electrostatic protection circuit.

In an embodiment, as shown in FIG. 5, the second portion of the driving circuit includes gate driving circuits 511 disposed on both sides of the substrate 21. The substrate 21 includes the upper side surface, the lower side surface, the left side surface, and the right side surface, and the connecting portion is disposed on the left side surface and the right side surface of the substrate 21. In the prior art, the gate driving circuits are disposed in the non-display region on both sides of the display panel to allow both sides to not need the use of chips, but causes the display panel to have bezels on the both sides. This embodiment of the present invention disposes the gate driving circuits on the left side and the right side of the back of the substrate. The connecting portion is disposed on the left side surface and the right side surface of the substrate to connect the gate driving circuits and the first portion, allowing the electrostatic protection circuit to work normally, so that a lower bezel of the display panel is reduced while not affecting the operation of the electrostatic protection circuit.

In an embodiment, the light-emitting layer includes mini light-emitting diode (LED) chips, and the mini LED chips include a red mini LED chip, a green mini LED chip, and a blue mini LED chip. In a configuration of the light-emitting layer, the red mini LED chip, the green mini LED chip, and the blue mini LED chip are used as a light source. The mini LED chips are driven by the driving circuit to emit light through the three mini LED chips connected to the driving circuit, so that the light-emitting layer emits various colors of light, thereby achieving image display.

In an embodiment, light-emitting layer includes micro LED chips, and the micro LED chips include a red micro LED chip, a green micro LED chip, and a blue micro LED chip.

In an embodiment, the connecting portion 223 includes a plurality of connecting wires 2231 and bonding terminals 2232 on both sides of each of the plurality of connecting wires 2231, and the bonding terminals 2232 are respectively connected to the first portion 221 and the second portion 222. When the connecting portion 223 is disposed, two sides of a connecting wire 2231 of the connecting portion 223 can be disposed in the bonding terminals 2232. Then, the bonding terminals 2232 are respectively connected to an end of a wiring of the first portion 221 and an end of a wiring of the second portion 222, and a normal connection between the first portion 221 and the second portion 222 is achieved, so that the first portion 221, the second portion 222, and the connecting portion 223 form a complete driving circuit, which makes the display panel work normally.

Figure 6:
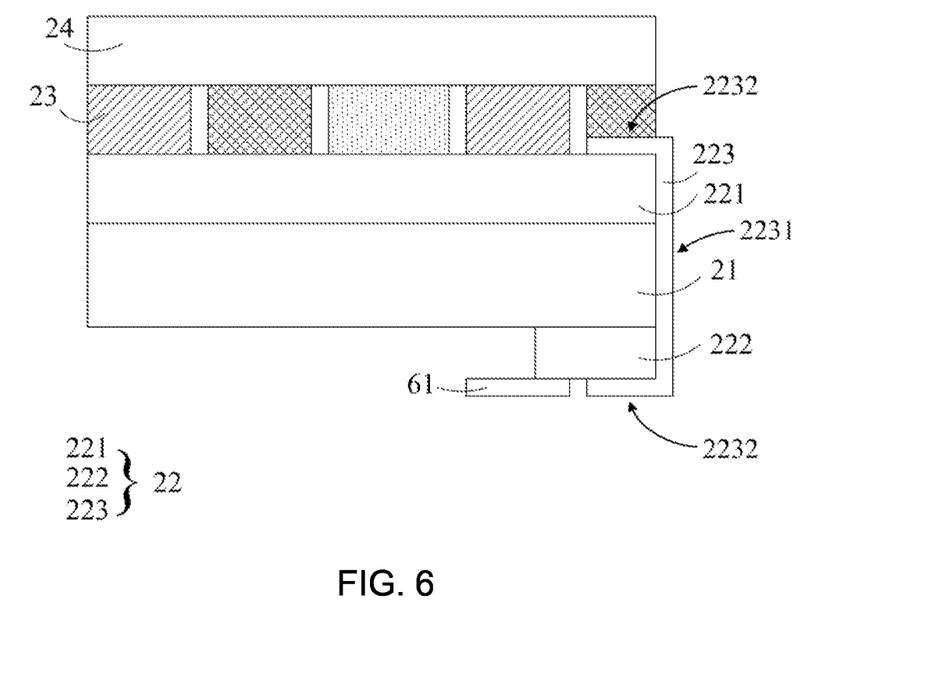
FIG. 6 a schematic diagram of a display device according to an embodiment of the present invention.

As shown in FIG. 6, an embodiment of the present invention provides a display device. The display device includes: a substrate 21, a driving circuit layer 22, a light-emitting layer 23, and a packaging layer 24, wherein the driving circuit layer 22 is attached to the substrate 21 and includes a driving circuit, the driving circuit includes a first portion 221, a second portion 222, and a connecting portion 223 connecting the first portion 221 and the second portion 222, the first portion 221 is disposed on a surface of the substrate 21, the second portion 222 is disposed on a surface of the substrate 21 away from the first portion 221, the light-emitting layer 23 is disposed on a surface of the first portion 221 away from the substrate 21 and is connected to the first portion 221, the packaging layer 24 is disposed on a surface of the light-emitting layer 23 away from the first portion 221, and a projection region of the second portion 222 on the substrate 21 is located in a projection region of the first portion 221 on the substrate 21; and a flip-chip film 61 connected to the second portion 222.

The present invention provides the display device. The display device includes the substrate, the driving circuit layer, the light-emitting layer, and the packaging layer. The driving circuit layer is attached to the substrate and includes the driving circuit. The driving circuit includes the first portion, the second portion, and the connecting portion connecting the first portion and the second portion. The first portion is disposed on the surface of the substrate, and the second portion is disposed on the surface of the substrate away from the first portion. The light-emitting layer is disposed on the surface of the first portion away from the substrate and is connected to the first portion. The packaging layer is disposed on the surface of the light-emitting layer away from the first portion. The projection region of the second portion on the substrate is located in the projection region of the first portion on the substrate. Because the flip-chip film is connected to the second portion, and the driving circuit of the driving circuit layer is divided into the first portion, the second portion, and the connecting portion, the first portion is disposed on the surface of the substrate, the second portion is disposed on another surface of the substrate, and the projection region of the second portion on the substrate is located in the projection region of the first portion on the substrate. Therefore, the second portion is located in the display region, the connecting region of external wires which cannot display is eliminated, the bezel of the display panel is eliminated, and a technical problem of a large bezel due to a large connecting region of external wires in current LED display panels is solved.

In an embodiment, the second portion includes a metal wire and a connecting terminal, and the flip-chip film is connected to the connecting terminal. Because the first portion is connected to the second portion by the connecting portion, the flip-chip film connected to the connecting terminal of the second portion can control the driving circuit and further control the display device to display.

In the display device of an embodiment, the substrate includes a first substrate, a second substrate, and an optical adhesive disposed between the first substrate and the second substrate. The first portion is disposed on a surface of the first substrate away from the second substrate, and the second portion is disposed on a surface of the second substrate away from the first substrate.

In the display device of an embodiment, a size of the first substrate is same as a size of the second substrate.

In the display device of an embodiment, a first alignment terminal is disposed on the first substrate, and a second alignment terminal is disposed on the second substrate to cooperate with the first alignment terminal.

In the display device of an embodiment, the first alignment terminal includes a protrusion, and the second alignment terminal includes a groove to cooperate with the first alignment terminal.

In the display device of an embodiment, the first alignment terminal includes a groove, and the second alignment terminal includes a protrusion to cooperate with the first alignment terminal.

In the display device of an embodiment, the second portion of the driving circuit includes an electrostatic protection circuit disposed on a lower side of the substrate, the substrate includes an upper side surface, a lower side surface, a left side surface, and a right side surface, and the connecting portion is disposed on the lower side surface of the substrate.

In the display device of an embodiment, the second portion of the driving circuit includes gate driving circuits disposed on both sides of the substrate, the substrate includes an upper side surface, a lower side surface, a left side surface, and a right side surface, and the connecting portion is disposed on the left side surface and the right side surface of the substrate.

In the display device of an embodiment, the light-emitting layer includes mini light-emitting diode (LED) chips, and the mini LED chips include a red mini LED chip, a green mini LED chip, and a blue mini LED chip.

In the display device of an embodiment, the connecting portion 223 includes a plurality of connecting wires 2231 and bonding terminals 2232 on both sides of each of the plurality of connecting wires 2231, and the bonding terminals 2232 are respectively connected to the first portion 221 and the second portion 222.

Figure 7:
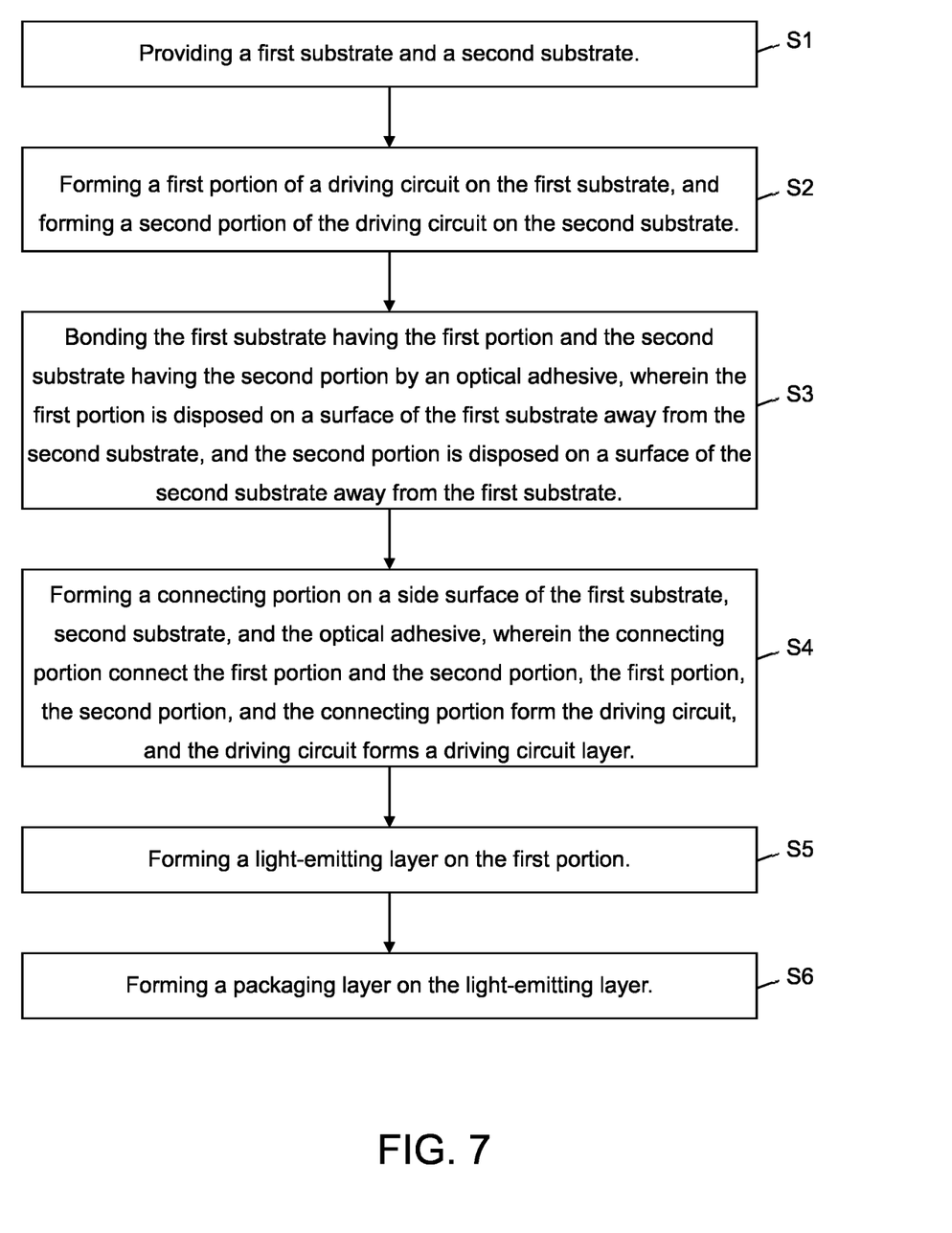
FIG. 7 is a flowchart of a manufacturing method of the display panel according to the embodiments of the present invention.

As shown in FIG. 7, an embodiment of the present invention provides a manufacturing method of a display panel. The manufacturing method of the display panel includes the steps of:

S1, providing a first substrate and a second substrate;

S2, forming a first portion of a driving circuit on the first substrate, and forming a second portion of the driving circuit on the second substrate;

S3, bonding the first substrate having the first portion and the second substrate having the second portion by an optical adhesive, wherein the first portion is disposed on a surface of the first substrate away from the second substrate, and the second portion is disposed on a surface of the second substrate away from the first substrate;

S4, forming a connecting portion on a side surface of the first substrate, second substrate, and the optical adhesive, wherein the connecting portion connect the first portion and the second portion, the first portion, the second portion, and the connecting portion form the driving circuit, and the driving circuit forms a driving circuit layer;

S5, forming a light-emitting layer on the first portion; and

S6, forming a packaging layer on the light-emitting layer.

The present invention provides the manufacturing method of the display panel. The display panel manufactured by the manufacturing method includes the substrate, the driving circuit layer, the light-emitting layer, and the packaging layer. The driving circuit layer is attached to the substrate and includes the driving circuit. The driving circuit includes the first portion, the second portion, and the connecting portion connecting the first portion and the second portion. The first portion is disposed on the surface of the substrate, and the second portion is disposed on the surface of the substrate away from the first portion. The light-emitting layer is disposed on the surface of the first portion away from the substrate and is connected to the first portion. The packaging layer is disposed on the surface of the light-emitting layer away from the first portion. The projection region of the second portion on the substrate is located in the projection region of the first portion on the substrate. Because the driving circuit of the driving circuit layer is divided into the first portion, the second portion, and the connecting portion, the first portion is disposed on the surface of the substrate, the second portion is disposed on another surface of the substrate, and the projection region of the second portion on the substrate is located in the projection region of the first portion on the substrate. Therefore, the second portion is located in the display region, the connecting region of external wires which cannot display is eliminated, the bezel of the display panel is eliminated, and a technical problem of a large bezel due to a large connecting region of external wires in current LED display panels is solved.

In an embodiment, the step of forming the connecting portion includes forming the connecting portion by inkjet printing or printing.

Figure 8:
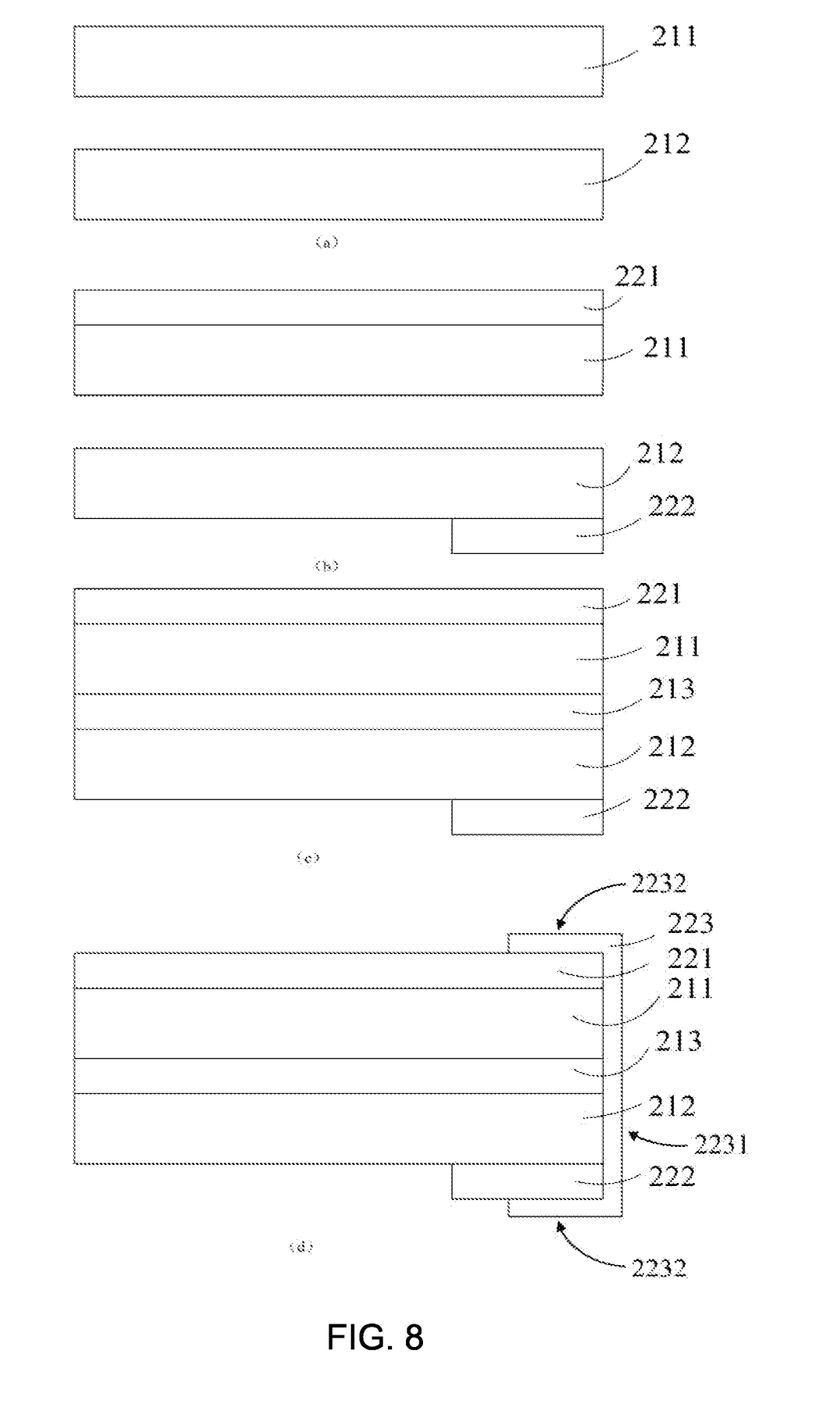
FIG. 8 is a state diagram of the display panel corresponding to the manufacturing method of the display panel according to the embodiments of the present application.

As shown in FIG. 8, FIG. 8(a) is a state diagram of the display panel corresponding to step S1 in FIG. 7. FIG. 8(b) is a state diagram of the display panel corresponding to step S2 in FIG. 7. FIG. 8(c) is a state diagram of the display panel corresponding to step S3 in FIG. 7. FIG. 8(d) is a state diagram of the display panel corresponding to step S4 in FIG. 7.

It can be known from the above embodiments:

The present invention provides the display panel, the manufacturing method thereof, and the display device. The display panel includes the substrate, the driving circuit layer, the light-emitting layer, and the packaging layer. The driving circuit layer is attached to the substrate and includes the driving circuit. The driving circuit includes the first portion, the second portion, and the connecting portion connecting the first portion and the second portion. The first portion is disposed on the surface of the substrate, and the second portion is disposed on the surface of the substrate away from the first portion. The light-emitting layer is disposed on the surface of the first portion away from the substrate and is connected to the first portion. The packaging layer is disposed on the surface of the light-emitting layer away from the first portion. The projection region of the second portion on the substrate is located in the projection region of the first portion on the substrate. Because the driving circuit of the driving circuit layer is divided into the first portion, the second portion, and the connecting portion, the first portion is disposed on the surface of the substrate, the second portion is disposed on another surface of the substrate, and the projection region of the second portion on the substrate is located in the projection region of the first portion on the substrate. Therefore, the second portion is located in the display region, the connecting region of external wires which cannot display is eliminated, the bezel of the display panel is eliminated, and a technical problem of a large bezel due to a large connecting region of external wires in current LED display panels is solved.

Understandably, those having ordinary skills of the art may easily contemplate various changes and modifications of the technical solution and technical ideas of the present invention and all these changes and modifications are considered in the protection scope of right for the present invention.

What is claimed is:

1. A display panel, comprising:
   a substrate;
   a driving circuit layer attached to the substrate and comprising a driving circuit, wherein the driving circuit comprises a first portion, a second portion, and a connecting portion connecting the first portion and the second portion, the first portion is disposed on a surface of the substrate, the second portion is disposed on a surface of the substrate away from the first portion, the connecting portion comprises a plurality of connecting wires and bonding terminals on two opposite ends of each of the plurality of connecting wires, one of the bonding terminals on one end of each of the plurality of connecting wires is connected to the first portion, and another one of the bonding terminals on another end of each of the plurality of connecting wires is connected to the second portion;

a light-emitting layer disposed on a surface of the first portion away from the substrate and connected to the first portion; and a packaging layer disposed on a surface of the light-emitting layer away from the first portion;

wherein a projection region of the second portion on the substrate is located in a projection region of the first portion on the substrate.

2. The display panel as claimed in claim 1, wherein the substrate comprises a first substrate, a second substrate, and an optical adhesive disposed between the first substrate and the second substrate, the first portion is disposed on a surface of the first substrate away from the second substrate, and the second portion is disposed on a surface of the second substrate away from the first substrate.

3. The display panel as claimed in claim 2, wherein a size of the first substrate is same as a size of the second substrate.

4. The display panel as claimed in claim 3, wherein a first alignment terminal is disposed on the first substrate, and a second alignment terminal is disposed on the second substrate to cooperate with the first alignment terminal.

5. The display panel as claimed in claim 4, wherein the first alignment terminal comprises a protrusion, and the second alignment terminal comprises a groove to cooperate with the first alignment terminal.

6. The display panel as claimed in claim 4, wherein the first alignment terminal comprises a groove, and the second alignment terminal comprises a protrusion to cooperate with the first alignment terminal.

7. The display panel as claimed in claim 1, wherein the second portion of the driving circuit comprises an electrostatic protection circuit disposed on a lower side of the substrate, the substrate comprises an upper side surface, a lower side surface, a left side surface, and a right side surface, and the connecting portion is disposed on the lower side surface of the substrate.

8. The display panel as claimed in claim 1, wherein the second portion of the driving circuit comprises gate driving circuits disposed on both sides of the substrate, the substrate comprises an upper side surface, a lower side surface, a left side surface, and a right side surface, and the connecting portion is disposed on the left side surface and the right side surface of the substrate.

9. The display panel as claimed in claim 1, wherein the light-emitting layer comprises mini light-emitting diode (LED) chips, and the mini LED chips comprise a red mini LED chip, a green mini LED chip, and a blue mini LED chip.

10. A display device, comprising:
a display panel comprising a substrate, a driving circuit layer, a light-emitting layer, and a packaging layer, wherein the driving circuit layer is attached to the substrate and comprises a driving circuit, the driving circuit comprises a first portion, a second portion, and a connecting portion connecting the first portion and the second portion, the first portion is disposed on a surface of the substrate, the second portion is disposed on a surface of the substrate away from the first portion, the connecting portion comprises a plurality of connecting wires and bonding terminals on two opposite ends of each of the plurality of connecting wires, one of the bonding terminals on one end of each of the plurality of connecting wires is connected to the first portion, another one of the bonding terminals on another end of each of the plurality of connecting wires is connected to the second portion, the light-emitting layer is disposed on a surface of the first portion away from the substrate and is connected to the first portion, the packaging layer is disposed on a surface of the light-emitting layer away from the first portion, and a projection region of the second portion on the substrate is located in a projection region of the first portion on the substrate; and a flip-chip film connected to the second portion.

11. The display device as claimed in claim 10, wherein the second portion comprises a metal wire and a connecting terminal, and the flip-chip film is connected to the connecting terminal.

12. The display device as claimed in claim 10, wherein the substrate comprises a first substrate, a second substrate, and an optical adhesive disposed between the first substrate and the second substrate, the first portion is disposed on a surface of the first substrate away from the second substrate, and the second portion is disposed on a surface of the second substrate away from the first substrate.

13. The display device as claimed in claim 12, wherein a size of the first substrate is same as a size of the second substrate.

14. The display device as claimed in claim 13, wherein a first alignment terminal is disposed on the first substrate, and a second alignment terminal is disposed on the second substrate to cooperate with the first alignment terminal.

15. The display device as claimed in claim 14, wherein the first alignment terminal comprises a protrusion, and the second alignment terminal comprises a groove to cooperate with the first alignment terminal.

16. The display device as claimed in claim 10, wherein the second portion of the driving circuit comprises an electrostatic protection circuit disposed on a lower side of the substrate, the substrate comprises an upper side surface, a lower side surface, a left side surface, and a right side surface, and the connecting portion is disposed on the lower side surface of the substrate.

17. The display device as claimed in claim 10, wherein the second portion of the driving circuit comprises gate driving circuits disposed on both sides of the substrate, the substrate comprises an upper side surface, a lower side surface, a left side surface, and a right side surface, and the connecting portion is disposed on the left side surface and the right side surface of the substrate.

18. The display device as claimed in claim 10, wherein the light-emitting layer comprises mini light-emitting diode (LED) chips, and the mini LED chips comprise a red mini LED chip, a green mini LED chip, and a blue mini LED chip.

* * * * *